United States Patent
Tomai et al.

(10) Patent No.: US 9,570,631 B2
(45) Date of Patent: Feb. 14, 2017

(54) OXIDE SEMICONDUCTOR SUBSTRATE AND SCHOTTKY BARRIER DIODE

(71) Applicant: IDEMITSU KOSAN CO., LTD., Tokyo (JP)

(72) Inventors: Shigekazu Tomai, Sodegaura (JP); Masatoshi Shibata, Sodegaura (JP); Emi Kawashima, Sodegaura (JP); Koki Yano, Sodegaura (JP); Hiromi Hayasaka, Sodegaura (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 0 days.

(21) Appl. No.: 14/912,800

(22) PCT Filed: Aug. 8, 2014

(86) PCT No.: PCT/JP2014/004154
§ 371 (c)(1),
(2) Date: Feb. 18, 2016

(87) PCT Pub. No.: WO2015/025500
PCT Pub. Date: Feb. 26, 2015

(65) Prior Publication Data
US 2016/0211386 A1    Jul. 21, 2016

(30) Foreign Application Priority Data

Aug. 19, 2013  (JP) ................................. 2013-169967
Feb. 20, 2014  (JP) ................................. 2014-030250

(51) Int. Cl.
*H01L 29/10*    (2006.01)
*H01L 29/872*   (2006.01)
(Continued)

(52) U.S. Cl.
CPC ............. *H01L 29/872* (2013.01); *H01L 29/24* (2013.01); *H01L 29/247* (2013.01); *H01L 29/26* (2013.01); *H01L 29/47* (2013.01)

(58) Field of Classification Search
CPC ...... H01L 29/872; H01L 29/24; H01L 29/247; H01L 29/26; H01L 29/47
See application file for complete search history.

(56) References Cited

U.S. PATENT DOCUMENTS

2007/0210316 A1* 9/2007 Yonezawa ........... H01L 21/0465
257/77
2010/0224878 A1* 9/2010 Kimura ............... H01L 27/1225
257/57
(Continued)

FOREIGN PATENT DOCUMENTS

JP   H05-036975 A   2/1993
JP   H08-097441 A   4/1996
(Continued)

OTHER PUBLICATIONS

International Search Report and English translation of Written Opinion of the International Searching Authority issued in PCT/JP2014/004154.
(Continued)

*Primary Examiner* — Yosef Gebreyesus
(74) *Attorney, Agent, or Firm* — Foley & Lardner LLP

(57) ABSTRACT

A Schottky barrier diode element includes an n-type or p-type silicon (Si) substrate, an oxide semiconductor layer, and a Schottky electrode layer, the oxide semiconductor layer including either or both of a polycrystalline oxide that includes gallium (Ga) as the main component and an amorphous oxide that includes gallium (Ga) as the main component.

30 Claims, 5 Drawing Sheets

(51) Int. Cl.
    *H01L 29/47*     (2006.01)
    *H01L 29/26*     (2006.01)
    *H01L 29/24*     (2006.01)

(56) References Cited

U.S. PATENT DOCUMENTS

| | | |
|---|---|---|
| 2011/0050733 A1 | 3/2011 | Yano et al. |
| 2014/0332823 A1 | 11/2014 | Takizawa et al. |
| 2016/0043238 A1 | 2/2016 | Takizawa et al. |

FOREIGN PATENT DOCUMENTS

| | | |
|---|---|---|
| JP | 2008-021689 A | 1/2008 |
| JP | 2009-164237 A | 7/2009 |
| JP | 2009-194225 A | 8/2009 |
| JP | 2012-138552 A | 7/2012 |
| JP | 5078039 B2 | 9/2012 |
| JP | 2013-042086 A | 2/2013 |
| JP | 2013-056802 A | 3/2013 |
| JP | 2013-102081 A | 5/2013 |
| WO | WO-2008/096768 A1 | 8/2008 |

OTHER PUBLICATIONS

K. Sasaki et al., The Japan Society of Applied Physics, "Applied Physics Express" vol. 5, Mar. 2002), 035502.

\* cited by examiner

OXIDE SEMICONDUCTOR SUBSTRATE AND SCHOTTKY BARRIER DIODE

TECHNICAL FIELD

The invention relates to an oxide semiconductor substrate and a Schottky barrier diode element that have rectifying characteristics.

BACKGROUND ART

A Schottky barrier diode is a diode that produces a rectifying action utilizing a potential barrier formed at the junction between a metal and a semiconductor. Si is most widely used as the semiconductor (see Patent Literature 1, for example). As a compound semiconductor having a band gap wider than that of Si, GaAs and, recently, SiC may be used instead of Si (see Patent Literatures 2 and 3, for example).

An Si-based Schottky diode is used for a high-speed switching element, a GHz-band transmission/reception mixer, a frequency conversion element, and the like. A GaAs-based Schottky diode can implement a higher-speed switching element, and is used for a microwave converter, a microwave mixer, and the like. It is considered that SiC can be applied to the electric vehicle field, the railroad field, the power transmission field, and the like (for which a higher voltage is required) due to its wide band gap.

A Schottky barrier diode that utilizes Si is relatively inexpensive, and is widely used. However, since the band gap of Si is as narrow as 1.1 eV, it is necessary to increase the size of the element in order to improve the breakdown characteristics. The band gap of GaAs is 1.4 eV, which is wider than that of Si. However, since it is difficult to implement the epitaxial growth of GaAs on an Si substrate, it is difficult to obtain a crystal with a small number of dislocations. Since the band gap of SiC is as wide as 3.3 eV, it is considered that a high dielectric breakdown field and better performance can be achieved by utilizing SiC. However, since the substrate production process and the epitaxial growth process require a high-temperature process, SiC has a problem from the viewpoint of mass productivity and cost.

Recently, $Ga_2O_3$ has attracted attention as a material having a band gap wider than that of SiC.

An oxide semiconductor is a material that has high mobility and a wide energy gap, and the application of an oxide semiconductor to a next-generation display driver transistor, a short-wavelength sensor, a low-power-consumption circuit, and the like has been desired. Non-Patent Literature 1 reports that monoclinic β-$Ga_2O_3$ was used for a power device, and VB=0.71 MV/cm was achieved. Patent Literature 4 discloses an example in which an ohmic electrode obtained by stacking monoclinic β-$Ga_2O_3$ and Ti is applied to a light-emitting diode.

$Ga_2O_3$ may have an α, β, γ, δ, or ∈ crystal structure. $Ga_2O_3$ having a β crystal structure (monoclinic crystal structure) has the highest thermal stability, and it has been reported that the band gap of $Ga_2O_3$ having a β crystal structure is 4.8 eV to 4.9 eV. A β-$Ga_2O_3$ monocrystalline substrate can be obtained using a floating zone (FZ) method or an edge-defined film-fed growth (EFG) method. However, since it is necessary to use a molecular beam epitaxy method at present in order to implement homoepitaxial growth, there is a problem from the viewpoint of mass productivity.

CITATION LIST

Patent Literature

Patent Literature 1: JP-A-2009-164237
Patent Literature 2: JP-A-H5-36975
Patent Literature 3: JP-A-H8-97441
Patent Literature 4: Japanese Patent No. 5078039

Non-Patent Literature

Non-Patent Literature 1: K. Sasaki et al., Appl. Phys. Express 5 (2012) 035502

SUMMARY OF INVENTION

The invention was conceived in view of the above problems. An object of the invention is to provide a Schottky barrier diode element that is obtained by forming a compound semiconductor having a wide band gap on an inexpensive substrate (e.g., Si wafer) at low cost with high mass productivity, and that exhibits excellent current-voltage characteristics.

Another object of the invention is to provide an oxide semiconductor substrate that is suitable for a Schottky barrier diode element, a diode element, and a power semiconductor element.

The invention provides the following Schottky barrier diode element and the like.

1. A Schottky barrier diode element including an n-type or p-type silicon (Si) substrate, an oxide semiconductor layer, and a Schottky electrode layer, the oxide semiconductor layer including either or both of a polycrystalline oxide that includes gallium (Ga) as the main component and an amorphous oxide that includes gallium (Ga) as the main component.
2. A Schottky barrier diode element including an n-type or p-type silicon (Si) substrate, an oxide semiconductor layer, and a Schottky electrode layer, the oxide semiconductor layer including a polycrystalline oxide that includes gallium (Ga) as the main component.
3. The Schottky barrier diode element according to 1 or 2, wherein the oxide semiconductor layer includes gallium at an atomic percentage ([Ga]/([Ga]+[total metal elements other than Ga])×100) of 90 to 100 at %.
4. The Schottky barrier diode element according to any one of 1 to 3, wherein the oxide semiconductor layer is formed on the silicon substrate, and the Schottky electrode layer is formed on the oxide semiconductor layer.
5. The Schottky barrier diode element according to any one of 1 to 3, wherein the Schottky electrode layer is formed on the silicon substrate, and the oxide semiconductor layer is formed on the Schottky electrode layer.
6. The Schottky barrier diode element according to any one of 1 to 5, wherein the oxide semiconductor layer includes at least one element selected from Si, Ge, Sn, Ti, Zr, and Hf in a ratio of 0.01 at % to 10 at % based on the total metal elements included in the oxide semiconductor layer.
7. The Schottky barrier diode element according to any one of 1 to 6, wherein the oxide semiconductor layer has a carrier concentration of $1\times10^{14}$ $cm^{-3}$ or more and $1\times10^{17}$ $cm^{-3}$ or less at room temperature.
8. The Schottky barrier diode element according to any one of 1 to 7, wherein the Schottky electrode layer is a metal thin film having a work function of 4.7 eV or more.
9. The Schottky barrier diode element according to any one of 1 to 8, wherein the oxide semiconductor layer is covered with an insulating film so that the edge of the oxide semiconductor layer is not exposed.
10. An electric circuit including the Schottky barrier diode element according to any one of 1 to 9.
11. An electric apparatus including the Schottky barrier diode element according to any one of 1 to 9.
12. An electronic apparatus including the Schottky barrier diode element according to any one of 1 to 9.
13. A vehicle including the Schottky barrier diode element according to any one of 1 to 9.
14. A structure including a metal thin film having a work function of 4.7 eV or more, and an oxide semiconductor that includes Ga as the main component, the structure having a region in which the metal thin film and the oxide semiconductor electrically contact with each other.
15. The structure according to 14, wherein the oxide semiconductor that includes Ga as the main component includes at least one element selected from Si, Ge, Sn, and Ti in a ratio of 0.01 at % or more and 10 at % or less based on the total metal elements included in the oxide semiconductor.
16. The structure according to 14 or 15, wherein the oxide semiconductor includes gallium at an atomic percentage ([Ga]/([Ga]+[total metal elements other than Ga])×100) of 90 to 100 at %.
17. The structure according to any one of 14 to 16, wherein the oxide semiconductor has a carrier concentration of $1\times10^{14}$ cm$^{-3}$ or more and $1)(10^{17}$ cm$^{-3}$ or less at room temperature.
18. The structure according to any one of 14 to 17, wherein the oxide semiconductor has a thickness of 50 nm to 20 µm.
19. The structure according to any one of 14 to 18, wherein the metal thin film is formed of Au, Cr, Cu, Fe, Ir, Mo, Nb, Ni, Pd, Pt, Re, Ru, W, $In_2O_3$, In—Sn—O, or In—Zn—O.
20. An oxide semiconductor substrate including a conductive substrate, and the structure according to any one of 14 to 19 that is stacked on the conductive substrate.
21. The oxide semiconductor substrate according to 20, wherein the conductive substrate is formed of one or more materials selected from monocrystalline silicon, polycrystalline silicon, and microcrystalline silicon.
22. An oxide semiconductor substrate including an insulating substrate, and the structure according to any one of 14 to 19 that is stacked on the insulating substrate.
23. A power semiconductor element wherein the oxide semiconductor substrate according to any one of 20 to 22 is used.
24. A diode element wherein the oxide semiconductor substrate according to any one of 20 to 22 is used.
25. A Schottky barrier diode element wherein the oxide semiconductor substrate according to any one of 20 to 22 is used.
26. A Schottky barrier diode element including the oxide semiconductor substrate according to any one of 20 to 22, the oxide semiconductor that includes Ga as the main component being an oxide semiconductor layer, and the metal thin film having a work function of 4.7 eV or more being a Schottky electrode layer.
27. An electric circuit including one or more elements selected from the group consisting of the power semiconductor element according to 23, the diode element according to 24, and the Schottky barrier diode element according to 25 or 26.
28. An electric apparatus including the electric circuit according to 27.
29. An electronic apparatus including the electric circuit according to 27.
30. A vehicle including the electric circuit according to 27.

The invention thus provides a Schottky barrier diode element that is obtained by forming a compound semiconductor having a wide band gap on an Si substrate at low cost with high mass productivity, and that exhibits excellent current-voltage characteristics.

The invention also thus provides an oxide semiconductor substrate that is suitable for a Schottky barrier diode element, a diode element, and a power semiconductor element.

DESCRIPTION OF EMBODIMENTS

1. Schottky Barrier Diode Element

Figure 1:
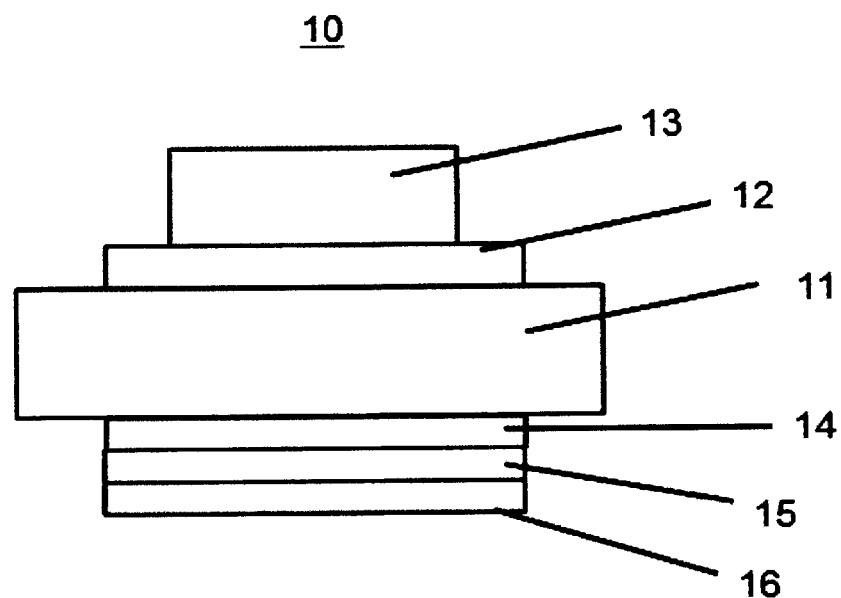
FIG. 1 is a cross-sectional view schematically illustrating one embodiment of the Schottky barrier diode element according to the invention.

The Schottky barrier diode element according to the invention includes an n-type or p-type silicon (Si) substrate, an oxide semiconductor layer, and a Schottky electrode layer, the oxide semiconductor layer including either or both of a polycrystalline oxide that includes gallium (Ga) as the main component and an amorphous oxide that includes gallium (Ga) as the main component.

The expression "the oxide semiconductor layer includes a polycrystalline oxide that includes gallium (Ga) as the main component" used herein means that the oxide semiconductor layer includes gallium at an atomic percentage ([Ga]/([Ga]+[total metal elements other than Ga])×100) of 90 to 100 at %. The term "polycrystalline oxide" used herein refers to an aggregate of $Ga_2O_3$ crystals in which the crystallographic directions are not necessarily identical. The term "amorphous oxide" used herein refers to an oxide for which a diffraction peak is not observed by X-ray diffraction analysis.

It is possible to provide a Schottky barrier diode element that has excellent current-voltage characteristics (particularly a high dielectric breakdown field) and high mass productivity by utilizing a gallium oxide-based polycrystalline material having a wide band gap.

The oxide semiconductor layer preferably includes gallium at an atomic percentage of 90 at % or more, and more preferably 95 at % or more, based on the total metal elements included in the oxide semiconductor layer. In this case, it is considered that the wide band gap of $Ga_2O_3$ is maintained, and a high breakdown voltage is achieved. The upper limit of the gallium content is not particularly limited. For example, the upper limit of the gallium content is 100 at %.

The oxide semiconductor layer may further include one or more elements selected from Si, Ge, Sn, Ti, Zr, and Hf. Specifically, the oxide semiconductor layer includes gallium oxide ($Ga_2O_3$), and optionally includes an oxide of these additional elements. The oxide of these additional elements is not particularly limited.

The additional element is preferably one or more elements selected from Si, Sn, Ti, and Zr.

The compositional ratio of the elements included in the oxide semiconductor layer may be quantitatively determined by secondary ion mass spectrometry (SIMS). More specifically, after the cross section of the semiconductor layer is exposed by polishing or the like, and the compositional ratio of the elements included in the oxide semiconductor layer is quantitatively determined by a calibration curve method using a standard sample having a known concentration.

When the oxide semiconductor layer is formed using a sputtering method, the compositional ratio of the elements included in the oxide semiconductor layer is almost identical to the composition of the sputtering target. The compositional ratio of the elements included in the sputtering target is determined by quantitatively analyzing the elements using an inductively coupled plasma atomic emission spectrometer (ICP-AES).

Specifically, when a solution sample is nebulized using a nebulizer, and introduced into an argon plasma (about 6,000 to 8,000° C.), each element included in the sample absorbs the thermal energy and is excited, and the orbital electrons migrate from the ground state to the orbital at a high energy level. The orbital electrons then migrate to the orbital at a lower energy level when about $10^{-7}$ to $10^{-8}$ seconds has elapsed. In this case, the difference in energy is emitted as light. Since the emitted light has an element-specific wavelength (spectral line), the presence or absence of each element can be determined based on the presence or absence of the spectral line.

More specifically, a solution sample prepared by dissolving the sputtering target in a solvent using an acid treatment is subjected to quantitative determination by a calibration curve method using a standard sample having a known concentration, and the concentration of each element included in the solution is converted into the content (composition) (at %) of each element included in the target.

Since the intensity (luminous intensity) of each spectral line is in proportion to the number of respective elements included in the sample, the concentration of each element in the sample can be determined through a comparison with a standard solution having a known concentration.

After specifying the elements included in the sample by qualitative analysis, the content of each element is determined by quantitative analysis, and the atomic ratio of each element is calculated from the results.

The gallium oxide used for the Schottky barrier diode element according to the invention is polycrystalline and/or amorphous. When the gallium oxide is polycrystalline, the gallium oxide may have an α, β, γ, δ, or ∈ crystal form, or may be a mixture thereof. Note that it is preferable that the gallium oxide include β-$Ga_2O_3$ as the main component from the viewpoint of operational stability.

Pure polycrystalline $Ga_2O_3$ has a wide band gap, but has a low carrier concentration at room temperature, and an increase in On-resistance occurs when it is operated as a diode. Heat may be generated when the On-resistance is high. Such a problem can be reduced by doping polycrystalline $Ga_2O_3$ with an appropriate amount of a positive tetravalent element such as one or more elements selected from Si, Ge, Sn, Ti, Zr, and Hf.

The amount of doping with these additional elements is preferably 0.01 at % to 10 at %, and more preferably 0.04 to 5 at %, based on the total metal elements included in the oxide semiconductor layer. If the amount of doping is less than 0.01 at %, the carrier concentration remains low in spite of doping. If the amount of doping exceeds 10 at %, segregation may occur at the grain boundaries of polycrystalline $Ga_2O_3$, and the dielectric breakdown field intensity may decrease when a reverse bias is applied.

The additional element(s) may be doped using a method that mixes $Ga_2O_3$ into the sputtering target, a method that effects cosputtering using a doping oxide target and $Ga_2O_3$, a method that effects ion doping with the desired donor atom after forming a $Ga_2O_3$ film, or the like. Note that the method that mixes $Ga_2O_3$ into the sputtering target has an advantage in that a uniform doping concentration profile can be obtained (i.e., high productivity can be achieved). The ion doping method has an advantage in that the doping profile can be controlled to a certain extent by controlling the accelerating voltage and time. For example, it is possible to improve the performance of the diode by doping an area situated at the interface with the Schottky electrode layer with the additional element(s) at a low concentration, and doping an area situated at the interface with the ohmic electrode layer with the additional element(s) at a high concentration.

The carrier concentration in the gallium oxide used for the Schottky barrier diode element according to the invention may also be adjusted by incorporating an oxide of one or more elements selected from Zn, In, Cd, Al, and Mg in the oxide semiconductor layer in a ratio of 0.01 at % to 10 at % based on the total metal elements included in the oxide semiconductor layer. This method has an effect of adjusting the band gap instead of doping $Ga_2O_3$ with an additional element. When ZnO, $In_2O_3$, CdO, or $SnO_2$ is added, the band gap of $Ga_2O_3$ becomes narrower, and the carrier concentration increases. When $Al_2O_3$ or MgO is added, the band gap of $Ga_2O_3$ becomes wider, and the carrier concentration decreases.

The band gap and the carrier concentration are parameters that determine the breakdown voltage and the On-resistance of the Schottky barrier diode. An optimum band gap and an optimum carrier concentration differ depending on the application. When a low On-resistance is important rather than the breakdown characteristics (breakdown voltage), the band gap may be narrowed as compared with that of $Ga_2O_3$. When the breakdown characteristics (breakdown voltage) are important rather than a low On-resistance, the band gap may be widened as compared with that of $Ga_2O_3$. The On-resistance and the breakdown voltage normally have a trade-off relationship. However, it is possible to adjust the On-resistance and the breakdown characteristics (breakdown voltage) in a well-balanced manner by utilizing an oxide semiconductor as compared with the case of using a known silicon-based material.

It is preferable that the oxide semiconductor layer have a carrier concentration of $1\times10^{14}$ cm$^{-3}$ or more and $1\times10^{17}$ cm$^{-3}$ or less at room temperature (298K) in order to obtain good diode characteristics. If the carrier concentration is less than $1\times10^{14}$ cm$^{-3}$, the On-resistance may increase to a large extent, and generation of heat may occur during operation. If the carrier concentration exceeds $1\times10^{17}$ cm$^{-3}$, the On-resistance may decrease to a large extent, and a leakage current when a reverse bias is applied may increase. The carrier concentration is more preferably $1\times10^{15}$ cm$^{-3}$ or more and $5\times10^{16}$ cm$^{-3}$ or less. The carrier concentration is measured using the method described in connection with the examples.

An n-type silicon substrate and a p-type silicon substrate may be used as the silicon (Si) substrate. A known silicon substrate that exhibits excellent surface flatness-smoothness (e.g., monocrystalline silicon substrate, polycrystalline silicon substrate, and microcrystalline silicon substrate) may be used as the silicon substrate.

Note that a microcrystal is classified as a polycrystal. A polycrystal is an aggregate of single crystals, and has clear grain boundaries, which may affect electrical characteristics. A microcrystal has a submicrometer particle size, and has no clear grain boundaries. Therefore, a microcrystal has an advantage in that a variation in electrical characteristics due to grain boundary scattering occurs to only a small extent.

The Schottky electrode layer is formed using a material having a work function of 4.7 eV or more. Specific examples of such a material include Ru, Au, Pd, Ni, Ir, Pt, and alloys thereof. If the work function is less than 4.7 eV, the height of the Schottky barrier may be low, and leakage may significantly occur when a reverse bias is applied.

On the other hand, the work function of a metal used for an ohmic electrode layer is preferably about 4.1 eV depending on the impurity concentration in a silicon wafer, and Ti and Mo are preferable taking account of adhesion.

In one embodiment of the Schottky barrier diode element according to the invention, the oxide semiconductor layer is formed on the silicon substrate, and the Schottky electrode layer is formed on the oxide semiconductor layer.

When using an n-type silicon wafer, a $Ga_2O_3$-based oxide semiconductor is stacked on the front side of the substrate, and an electrode layer (e.g., Pt, Au, Pd, or Ni) that forms a Schottky barrier is stacked on the $Ga_2O_3$-based oxide semiconductor. An electrode layer (e.g., Ti) that forms an ohmic junction with n-type silicon is stacked on the back side of the substrate. It is preferable to stack a good conductor (e.g., Au) on the back side of the substrate through Ni in order to ensure conduction. Note that Ni prevents the diffusion of Au.

In another embodiment of the Schottky barrier diode element according to the invention, the Schottky electrode layer is formed on the silicon substrate, and the oxide semiconductor layer is formed on the Schottky electrode layer.

When using a p-type silicon wafer, the Schottky electrode layer (e.g., Pt, Au, Pd, or Ni) is stacked on the front side of the substrate, and a $Ga_2O_3$-based oxide semiconductor is formed on the Schottky electrode layer using a sputtering method. In this case, a Schottky barrier is formed at the interface between the metal (e.g., Pt, Au, Pd, or Ni) and the oxide semiconductor layer. It is possible to obtain better diode characteristics by oxidizing the surface of the Schottky electrode layer using an oxygen plasma, UV ozone, or the like before forming the oxide semiconductor layer.

When the oxide semiconductor layer is formed by a sputtering method using pure $Ga_2O_3$, it is preferable to dope the oxide semiconductor layer by ion doping with a positive tetravalent element such as one or more elements selected from Si, Ge, Sn, Ti, Zr, and Hf. The oxide semiconductor layer is mainly doped on the surface thereof, and it is necessary to adjust the field intensity during doping so that the Schottky interface is not reached. After completion of ion doping, the oxide semiconductor layer is annealed at 200° C. or higher and 600° C. or lower in order to effect activation.

A metal (e.g., Ti) that forms an ohmic junction with the oxide semiconductor layer is stacked on the oxide semiconductor layer. In this case, a good conductor (e.g., Au) may be further stacked through Ni. An electrode that exhibits excellent adhesion and assists in conduction is stacked on the back side of the p-type silicon wafer.

A known guard ring structure may be provided to the Schottky barrier diode element according to the invention. The guard ring is provided between the oxide semiconductor layer and the Schottky electrode layer, and has an effect of increasing the breakdown voltage. An electric field may be concentrated on the edge of the oxide semiconductor layer so that a dielectric breakdown may easily occur. It is possible to further increase the breakdown voltage by stacking an insulating film (e.g., $SiO_2$) so as to cover the edge of the oxide semiconductor layer.

It is preferable that the Schottky barrier diode element according to the invention have a structure in which the oxide semiconductor layer is covered with an insulating film so that the edge thereof is not exposed.

The oxide semiconductor layer, the Schottky electrode layer, the ohmic electrode layer, and the like that form the Schottky barrier diode element according to the invention may be formed using a known sputtering method or the like that can be implemented at low cost with high mass productivity (see the examples).

A thin oxide film having a thickness of 10 nm or less may be stacked at the interface between the electrode layer that forms the Schottky electrode and the oxide semiconductor layer by performing reactive sputtering when forming the Schottky electrode by sputtering while introducing oxygen.

After forming the oxide semiconductor layer, the oxide semiconductor layer may be annealed to effect crystallization. It is possible to lower the On-resistance and prevent generation of heat by crystallizing the oxide semiconductor. The annealing conditions are not particularly limited. For example, after forming the oxide semiconductor layer, the oxide semiconductor layer is allowed to stand at 500° C. for 0.5 hours in nitrogen to stabilize the oxidation state. After forming the electrode layer, the oxide semiconductor layer is annealed at 200° C. for 1 hour in air. Whether or not the oxide semiconductor has been crystallized may be determined by X-ray diffraction (XRD) measurement or using a TEM.

Note that it is preferable to use the oxide semiconductor layer in an amorphous state when a crystal grain boundary, a lattice defect, and the like may be produced due to polycrystallization, and may decrease the breakdown voltage. When using the oxide semiconductor layer in an amorphous state, the oxide semiconductor layer may be heated at 300° C. or less for 1 hour or less taking account of the types of the elements that form the oxide semiconductor layer. It is possible to obtain a stable amorphous state by heating the oxide semiconductor layer at a temperature as low as 300° C. or less.

The Schottky barrier diode element according to the invention has a high dielectric breakdown field. The dielectric breakdown field of the Schottky barrier diode element according to the invention is preferably 0.5 MV/cm or more, and more preferably 0.7 MV/cm or more. In this case, since it is possible to design the diode to have a small thickness, it is possible to reduce the size of the element, and it is advantageous in terms of heat dissipation.

The n-value of the Schottky barrier diode element according to the invention is preferably 2 or less, and more preferably 1.5 or less. In this case, it is possible to lower the On-resistance, and reduce or suppress generation of heat.

The Schottky barrier diode element according to the invention is suitably used for an electric circuit, an electric apparatus, an electronic apparatus, a vehicle, and an electric vehicle.

2. Structure and Oxide Semiconductor Substrate

The structure according to the invention includes a metal thin film having a work function of 4.7 eV or more, and an oxide semiconductor that includes Ga as a main component, the structure having a region in which the metal thin film and the oxide semiconductor electrically contact with each other.

When the structure according to the invention is applied to a Schottky barrier diode element, the metal thin film having a work function of 4.7 eV or more functions as a Schottky electrode layer, and the oxide semiconductor that includes Ga as the main component functions as an oxide semiconductor layer.

The oxide semiconductor substrate according to the invention includes a conductive substrate, and the structure according to the invention that is stacked on the conductive substrate.

The oxide semiconductor substrate according to the invention is an intermediate that is useful for producing a Schottky barrier diode element, a power semiconductor element, and a diode element.

The Schottky barrier diode element according to the invention that achieves the above object includes a structure that has a region in which a metal thin film having a work function of 4.7 eV or more and an oxide semiconductor that includes Ga as the main component electrically contact with each other.

The expression "a metal thin film and an oxide semiconductor electrically contact with each other" used herein refers to a contact state in which the metal thin film and the oxide semiconductor film form a junction so that electrons can freely diffuse from the oxide semiconductor into the metal thin film such that the metal thin film and the oxide semiconductor film are identical as to Fermi energy. The region in which the metal thin film and the oxide semiconductor electrically contact with each other may be a region in which the metal thin film and the oxide semiconductor are bonded directly in a state in which an insulating film or the like is not interposed therebetween.

It is preferable that the oxide semiconductor that includes Ga as the main component include at least one element selected from Si, Ge, Sn, Ti, Hf, and Zr in a ratio of 0.01 at % or more and 10 at % or less based on the total metal elements included in the oxide semiconductor.

It is preferable that the oxide semiconductor that includes Ga as the main component include gallium at an atomic percentage ([Ga]/([Ga]+[total metal elements other than Ga])×100) of 90 to 100 at %.

It is preferable that the oxide semiconductor that is included in the structure and includes Ga as the main component have a carrier concentration of $1 \times 10^{14}$ cm$^{-3}$ or more and $1 \times 10^{17}$ cm$^{-3}$ or less at room temperature (298K). The carrier concentration is more preferably $1 \times 10^{15}$ cm$^{-3}$ or more and $5 \times 10^{16}$ cm$^{-3}$ or less.

The carrier concentration may be determined using the measurement method described in connection with the examples.

Examples of the metal thin film having a work function of 4.7 eV or more include a film formed of a metal such as Au, Cr, Cu, Fe, Ir, Mo, Nb, Ni, Pd, Pt, Re, Ru, or W, a film formed of a metal oxide such as $In_2O_3$, ITO (In—Sn—O), or IZO (In—Zn—O), and the like. Note that it is advantageous to use a metal having a larger work function and a higher carrier concentration in order to obtain clear rectifying characteristics. The work function is more preferably 4.8 eV or more, and still more preferably 5.0 eV or more. The upper limit of the work function is not particularly limited. For example, the upper limit of the work function is 5.6 eV.

When using a metal oxide as the material for forming the metal thin film, it is preferable that the metal have a carrier concentration of $10^{20}$ cm$^{-3}$ or higher. If the carrier concentration is lower than $10^{20}$ cm$^{-3}$, the extent of a depletion layer may increase when the metal thin film is stacked on the oxide semiconductor that includes Ga as the main component, and internal resistance may occur, or high-speed switching characteristics may be impaired. It is more preferable to use Au, Ir, Ni, Pd, or W as the material for forming the metal thin film when the metal thin film is stacked on the oxide semiconductor that includes Ga as the main component.

A trace amount of metal may be added to these materials to such an extent that the work function does not decrease in order to improve workability. For example, an alloy to which Ag and Cu are added may be used when Au is used as the material for forming the metal thin film, and an alloy to which Ag and Cu are added may be used when Pd is used as the material for forming the metal thin film.

The work function is measured using a photoelectron spectrometer (e.g., "AC-3" manufactured by Riken Keiki Co., Ltd.). The work function changes due to a surface treatment (e.g., acid or alkali surface treatment), UV cleaning, and the like. Note that the term "work function" used herein refers to a value measured directly after a film has been formed without performing an additional treatment.

At least one element selected from Si, Ge, Sn, and Ti may be added to the oxide semiconductor that includes Ga as the main component. The concentration (total concentration) of the additional element(s) in the oxide semiconductor is preferably 0.01 at % or more and 10 at % or less based on the total metal elements included in the oxide semiconductor. If the total concentration of the additional element(s) added to the oxide semiconductor is 0.01 at % or less, the carrier concentration in $Ga_2O_3$ may decrease, and an increase in electrical resistance may occur. If the total concentration of the additional element(s) added to the oxide semiconductor exceeds 10 at %, the conduction path of $Ga_2O_3$ that provides electrical conduction may be interrupted, and a decrease in mobility and an increase in electrical resistance may occur. Therefore, the forward voltage may increase, and power loss or generation of heat may occur when the oxide semiconductor to which at least one element selected from Si, Ge, Sn, and Ti is added at a concentration outside the above range is used.

The oxide semiconductor that includes Ga as the main component that is used in connection with the invention may have an arbitrary structure (e.g., monocrystalline, amorphous, or polycrystalline structure). It is considered that the On-resistance becomes a minimum when the oxide semiconductor has a monocrystalline structure. Note that the oxide semiconductor need not necessarily have a monocrystalline structure. Since the oxide semiconductor that includes Ga as the main component has a wide band gap as compared with crystalline Si as well as SiC and GaN that are used for a next-generation power device, the oxide semiconductor has a high dielectric breakdown field. Therefore, it is possible to achieve a moderate On-resistance and a high breakdown voltage by reducing the film thickness when a very high voltage is not required. Note that it is necessary to suppress a situation in which crystal growth occurs to an excessive extent when using an oxide semiconductor having a polycrystalline structure since leakage may occur through the grain boundaries.

The oxide semiconductor that includes Ga as the main component that is used in connection with the invention may be formed by applying a vacuum vapor-phase method such as a sputtering method, a vacuum deposition method, or a CVD method, a normal pressure vapor-phase method such as an atmospheric pressure CVD method, a spray pyrolysis method, or a mist CVD method, a liquid-phase method such as a spin coating method, an inkjet method, a casting method, a micelle disruption method, or an electrodeposition method, or the like. Note that it is also possible to use an epitaxial growth method (e.g., laser ablation, MBE, or MOCVD) as a film-forming method that forms a single crystal so as to have the same lattice constants as those of the substrate.

However, since the oxide semiconductor that includes Ga as the main component that is used in connection with the invention may have an arbitrary structure, an epitaxial method need not necessarily be used in view of productivity and mass productivity. It is advantageous to increase the film thickness in order to obtain a higher breakdown voltage. A normal pressure gas-phase method and a liquid-phase method are advantageous from the viewpoint of obtaining a relatively thick film. However, impurities may be mixed, and a moderate heat treatment is required when using a normal pressure gas-phase method or a liquid-phase method. Note that a micelle disruption method, an electrodeposition method, and the like achieves excellent throwing power, and it is considered that leakage can be prevented when these methods are applied to a diode.

A CVD method such as a thermal CVD method, a CAT-CVD method, a photo-CVD method, a mist CVD method, an MO-CVD method, or a plasma CVD method, an atomic-level film-forming method such as an MBE method or an ALD method, a PVD method such as an ion plating method, an ion-beam sputtering method, or a magnetron sputtering method, a method that utilizes a known ceramic process, such as a doctor blade method, an injection method, an extrusion method, a hot press method, a sol-gel method, or an aerosol deposition method, a wet method such as a coating method, a spin coating method, a printing method, a spray method, an electrodeposition method, a plating method, or a micelle disruption method, or the like may be used as the thin film-forming method. The dielectric breakdown field of the oxide semiconductor used for the Schottky barrier diode (Schottky barrier diode element) according to the invention is 0.5 to 3 MV·cm, which is significantly higher than that of a known silicon-based diode. The desired breakdown voltage differs depending on the application and the objective. A film thickness of 0.2 μm to 1.2 μm is required when a breakdown voltage of 60 V is desired, and a film thickness of 2 μm to 12 μm is required when a breakdown voltage of 600 V is desired. In particular, when it is desired to form a film having a thickness of 2 μm or more, it is advantageous to use a CVD method or a wet method as compared with a PVD method from the viewpoint of the production process.

The thickness of the oxide semiconductor is preferably 50 nm or more and 20 μm or less. If the thickness of the oxide semiconductor is less than 50 nm, the breakdown voltage decreases to about 10 V, which is insufficient for most applications. A breakdown voltage of 5,000 V may be achieved when the thickness of the oxide semiconductor is larger than 20 μm. In this case, however, generation of heat may occur during switching due to an increase in On-resistance. The thickness of the oxide semiconductor is more preferably 200 nm or more and 12 μm or less.

The thickness of the oxide semiconductor may be measured using a stylus profilometer (e.g., Surfcorder or DEK-TAK) or an electron microscope (e.g., SEM or TEM).

The structure according to the invention may be stacked on a conductive substrate, or may be stacked on an insulating substrate. Note that it is possible to achieve better heat dissipation by stacking the structure according to the invention on a conductive substrate. A known substrate that exhibits excellent surface flatness-smoothness (e.g., monocrystalline silicon substrate, polycrystalline silicon substrate, or microcrystalline silicon substrate) may be used as the conductive substrate.

The oxide semiconductor substrate according to the invention is required to exhibit surface flatness-smoothness. When the oxide semiconductor substrate is used in the vertical direction, electrical conductivity is also required for the oxide semiconductor substrate. A silicon substrate can meet the above conditions at low cost. Note that a substrate formed of a metal such as Cu, Al, Mo, W, Ni, Cr, Fe, Nd, Au, Ag, Nd, or Pd, or an alloy thereof may also be used. In particular, it is considered that a heat dissipation effect is achieved when a metal material having high thermal conductivity is used. A heat sink structure may be employed when further heat dissipation is required. A compound monocrystalline wafer (e.g., GaAs and InP), and a substrate formed an oxide, a nitride, a carbide, and the like (e.g., $Al_2O_3$, ZnO, MgO, $SrTiO_3$, YSZ, lanthanum aluminate, $Y_3Al_5O_{12}$, $NdGaO_3$, sapphire, AlN, GaN, SiC, alkali-free glass, and soda lime glass) may also be used. When the oxide semiconductor substrate is used in the lateral direction, an insulating substrate may also be used. Note that the term "vertical direction" used herein means that a current is caused to flow in the direction perpendicular to the surface of the oxide semiconductor, and the term "lateral direction" used herein means that a current is caused to flow in the direction horizontal to the surface of the oxide semiconductor.

Examples of the insulating substrate include a glass substrate and a resin substrate (e.g., polycarbonate, polyarylate, polyethylene terephthalate, polyethersulfone, polyimide, and phenolic resin).

Since the structure according to the invention does not require a high-temperature process, a power supply for a circuit that drives a display (e.g., liquid crystal display or organic EL display) can be provided on the same substrate as the display, for example.

When staking an ohmic electrode on the oxide semiconductor substrate according to the invention, it is preferable to select a material that has a work function close to the work function (3.7 eV to 4.3 eV) of the oxide semiconductor that includes $Ga_2O_3$ as the main component. The work function of the oxide semiconductor that includes $Ga_2O_3$ as the main component varies depending on the type and the concentration of each element. It is preferable to use Ti as the material for forming the ohmic electrode taking account of adhesion.

It is preferable that the oxide semiconductor that includes $Ga_2O_3$ as the main component used in connection with the invention have an amorphous structure or a polycrystalline structure. When using an oxide semiconductor having a polycrystalline structure, leakage may easily occur through the grain boundaries due to excessive crystal growth.

After forming the $Ga_2O_3$ film, an annealing treatment may be performed to such an extent that the growth of a polycrystal does not occur excessively. The annealing treatment reduces the abstraction of oxygen in the subsequent step that stacks the ohmic electrode. If the annealing treatment is not performed, oxygen may migrate from $Ga_2O_3$ to the ohmic electrode in the step that stacks the ohmic electrode, and the carrier concentration in the $Ga_2O_3$ region may increase. If the abstraction of oxygen reaches the Schottky region, the rectifying effect may be lost.

The oxide semiconductor substrate according to the invention is suitably used for a power semiconductor element, a diode element, and a Schottky barrier diode element. An electric circuit that includes one or more elements among the power semiconductor element, the diode element, and the Schottky barrier diode element is suitably used for an electric device, an electronic device, and an electric vehicle.

The invention provides a stack that is suitable as a member that forms a power semiconductor element (diode element, IGBT element, and MOSFET). In particular, the invention can advantageously provide a Schottky barrier diode element, a PN diode element, and a PIN diode element.

It is possible to reduce or suppress generation of heat and reduce power consumption by applying the invention to a rectifier diode used for a power supply circuit, a fast recovery diode used for a PWM inverter circuit, and the like. In particular, an inverter circuit is required to have a high operating frequency and a short switching recovery time. Since it is possible to implement a reduction in thickness and a monopolar structure as compared with a known fast recovery diode, it is possible to significantly reduce the recovery time. Therefore, it is possible to more effectively utilize the features of the diode according to the invention as the operating frequency increases.

For example, a GTO has been used as an inverter circuit used for vehicles. The GTO is suitable for a high-power switching operation. However, since the frequency is about 500 Hz, significant noise occurs at the time of start. Therefore, an IGBT has been increasingly provided to a vehicle and an EV in recent years. The switching speed of the IGBT can be increased to several tens of kHz, and it is possible to reduce or suppress noise, and reduce the size of a peripheral member. In principle, the switching loss of the IGBT is small. However, since the operating frequency of the IGBT is high, it is significantly effective to reduce the reverse leakage current of the fast recovery diode that is used in combination with the IGBT in order to reduce power consumption. Therefore, the diode according to the invention for which the reverse leakage current is smaller than that of a known Si diode is particularly effective as a fast recovery diode used for an IGBT inverter. The effect further increases when it is desired to increase the operating frequency and achieve smoother operation. Since it is also possible to reduce or suppress generation of heat, it is possible to further simplify the cooling mechanism. For example, a plurality of cooling mechanisms required for an EV can be replaced by a 110° C. radiator.

EXAMPLES

The invention is further described below by way of examples with appropriate reference to the drawings.

Example 1

FIG. 1 is a cross-sectional view schematically illustrating a Schottky barrier diode element obtained in Example 1.

An n-type silicon (Si) substrate 11 having a resistivity of 0.02 Ω·cm was provided, and treated with diluted hydrofluoric acid to remove a natural oxide film from the surface of the substrate. The Si substrate (wafer) was placed in a sputtering device ("HSM552" manufactured by Shimadzu Corporation). A sputtering discharge was effected at an RF power of 100 W using a $Ga_2O_3$ sintered body including 500 ppm of Si (this composition is hereinafter referred to as "Si—$Ga_2O_3$") as the sputtering target to form an Si—$Ga_2O_3$ film (gallium oxide film) 12 having a thickness of 300 nm on the surface of the Si substrate from which an oxide film was removed.

The Si—$Ga_2O_3$ film was patterned by photolithography to form the desired pattern, and annealed at 500° C. for 0.5 hours in nitrogen to effect crystallization. The crystal state of the Si—$Ga_2O_3$ film was determined by XRD measurement. The Si substrate on which the polycrystalline Si—$Ga_2O_3$ film was formed was placed in the sputtering device, and sputtering was performed using a Pt target to form a Pt electrode 13 on the polycrystalline Si—$Ga_2O_3$ film (i.e., a Schottky junction was formed).

The substrate was immersed in diluted hydrofluoric acid to remove a natural oxide film from the surface of the substrate on which the polycrystalline Si—$Ga_2O_3$ film was not formed, and a Ti film 14, an Ni film 15, and an Au film 16 were sequentially formed by sputtering to form an ohmic electrode. The resulting stack was annealed at 200° C. for 1 hour in air to obtain a Schottky barrier diode element 10.

CV (capacitance-voltage) measurement was performed in order to determine the carrier concentration in the Si—$Ga_2O_3$ film at room temperature. The depletion layer capacitance C (F/cm$^2$) per unit area is represented by $C=\epsilon/W$. Note that $\epsilon$ is the dielectric constant (F/cm) of the semiconductor, and W is the width (cm) of the depletion layer. When a forward bias voltage V (V) is applied to the Schottky diode, the width of the depletion layer is represented by $W=\{2\epsilon(\phi-V)/qN\}(\frac{1}{2})$. Therefore, the depletion layer capacitance per unit area is represented by $C=\{q\epsilon N/2(\phi-V)\}(\frac{1}{2})$. Note that q is the elementary charge(=1.6×10$^{-19}$ (C)), and $\phi$ is the built-in potential (V) that represents the difference in contact potential between the Pt electrode and the Si—$Ga_2O_3$ film.

The $C^{-2}$-V characteristics determined by the CV measurement are plotted, and the doping concentration (=carrier concentration) N is calculated from the slope of the $C^{-2}$-V characteristics. The carrier concentration calculated from the slope of the $C^{-2}$-V characteristics was 5×10$^{15}$ cm$^{-3}$.

The current-voltage characteristics of the resulting Schottky barrier diode element were measured, and the n-value and the reverse breakdown voltage were calculated. Note that the n-value is a parameter that represents the characteristic of a Schottky barrier diode element (see the following expression (1)). Ideal element characteristics are obtained when the n-value is close to 1.

$$I=I0[\exp(eV/nkT)] \tag{1}$$

I: Total current density (A/cm$^2$) of current that flows from gallium oxide film toward Si substrate
e: Carrier (1.60×10$^{-19}$ (C))
V: Voltage (V) applied to element
I0: Current density (A/cm$^2$) when voltage (V) applied to element is 0 V
k: Boltzmann constant (1.38×10$^{-23}$ (J/K))

T: Temperature (K)

The n-value was calculated to be 1.7, and the reverse breakdown voltage was calculated to be 23 V. This reverse breakdown voltage corresponds to an dielectric breakdown field of 0.77 MV/cm, which is higher than that of a known Schottky barrier diode that utilizes monocrystalline Si by a factor of about 2.

Note that the reverse breakdown voltage is calculated by "reverse breakdown voltage (V)=dielectric breakdown field (V/cm)×thickness (cm) of semiconductor".

The results are shown in Table 1. Note that "Forward voltage" in Table 1 is a voltage required to achieve a current density of 0.1 mA/cm$^2$, and "On-current density" in Table 1 is a current density when a voltage of 10 V is applied.

Examples 2 and 3

A Schottky barrier diode element was produced using a sputtering method in the same manner as in Example 1, except that the Schottky electrode and the semiconductor composition were appropriately changed as shown in Table 1. The measurement results for the current-voltage characteristics are shown in Table 1.

Example 4

An n-type Si substrate having a resistivity of 0.02 Ω·cm was provided, and treated with diluted hydrofluoric acid to remove a natural oxide film from the surface of the substrate. The Si substrate (wafer) was placed in a sputtering device ("HSM552" manufactured by Shimadzu Corporation). $Ga_2O_3$ was used as the sputtering target. A sputtering discharge was effected at an RF power of 100 W to form a gallium oxide film having a thickness of 300 nm on the surface of the Si substrate from which an oxide film was removed.

The Si substrate (wafer) on which the gallium oxide film was formed was placed in an ion doping implantation device, and doped with Si at a concentration of 0.5 at %. The Si substrate was then annealed at 500° C. for 1 hour in air to activate Si and form a polycrystalline $Ga_2O_3$ film. The polycrystalline $Ga_2O_3$ film was patterned by photolithography to form the desired pattern. The substrate was placed in the sputtering device, and sputtering was performed using a Pt target to form a Pt electrode on the polycrystalline $Ga_2O_3$ film (i.e., a Schottky junction was formed).

The substrate was immersed in diluted hydrofluoric acid to remove a natural oxide film from the surface of the substrate on which the polycrystalline $Ga_2O_3$ film was not formed, and a Ti film, an Ni film, and an Au film were sequentially formed by sputtering to form an ohmic electrode. The resulting stack was annealed at 200° C. for 1 hour in air to obtain a Schottky barrier diode element.

The CV measurement was performed in the same manner as in Example 1. The n-value was calculated to be 1.3, and the reverse breakdown voltage was calculated to be 30 V. This reverse breakdown voltage corresponds to an dielectric breakdown field of 1.0 MV/cm, which is higher than that of a known Schottky barrier diode that utilizes monocrystalline Si by a factor of about 3.

Example 5

Figure 2:
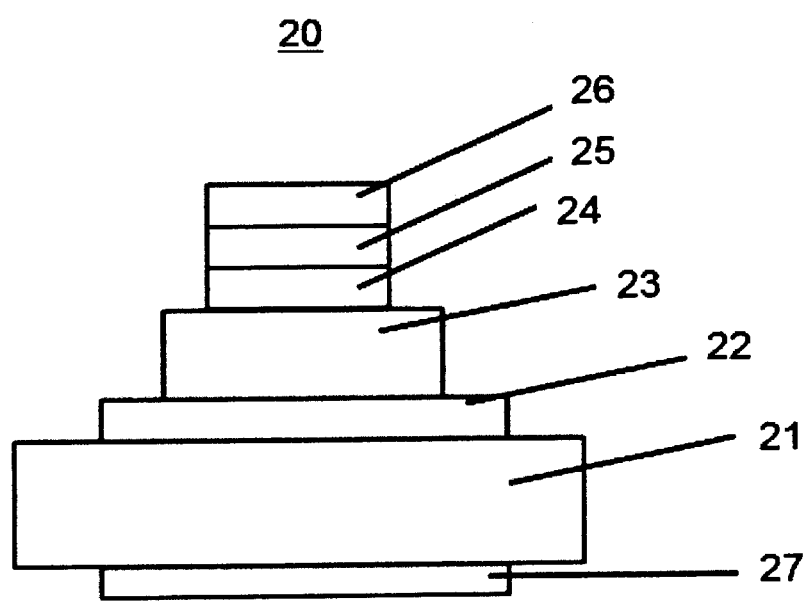
FIG. 2 is a cross-sectional view schematically illustrating one embodiment of the Schottky barrier diode element according to the invention.

FIG. 2 is a cross-sectional view schematically illustrating a Schottky barrier diode element obtained in Example 5.

A p-type silicon substrate 21 having a resistivity of 0.02 Ω·cm was provided, and treated with diluted hydrofluoric acid to remove a spontaneous oxide film. Sputtering was then performed using an Ni target to form an Ni electrode 22. The surface of the Ni electrode was oxidized using UV ozone, and sputtering was performed using a $Ga_2O_3$ target including 1 wt % of Sn to form an Sn—$Ga_2O_3$ film 23 having a thickness of 300 nm. The resulting stack was annealed at 500° C. for 0.5 hours in nitrogen, and a Ti film 24, an Ni film 25, and an Au film 26 were sequentially formed on the Sn—$Ga_2O_3$ film by sputtering to form an ohmic electrode.

After removing a natural oxide film from the surface of the p-type silicon substrate (opposite to the surface on which the Ni electrode was formed) by using a diluted hydrofluoric acid, a TiAl film 27 was formed by sputtering using a TiAl alloy as the target. The resulting stack was annealed at 200° C. for 1 hour in air to obtain a Schottky barrier diode element 20. The resulting diode was opposite in polarity to the diodes of Examples 1 to 5. A forward bias is applied when the p-type silicon wafer is connected to the positive terminal of the power supply, and a reverse bias is applied when the p-type silicon wafer is connected to the negative terminal of the power supply.

The measurement results for the current-voltage characteristics are shown in Table 1.

Example 6

Figure 3:
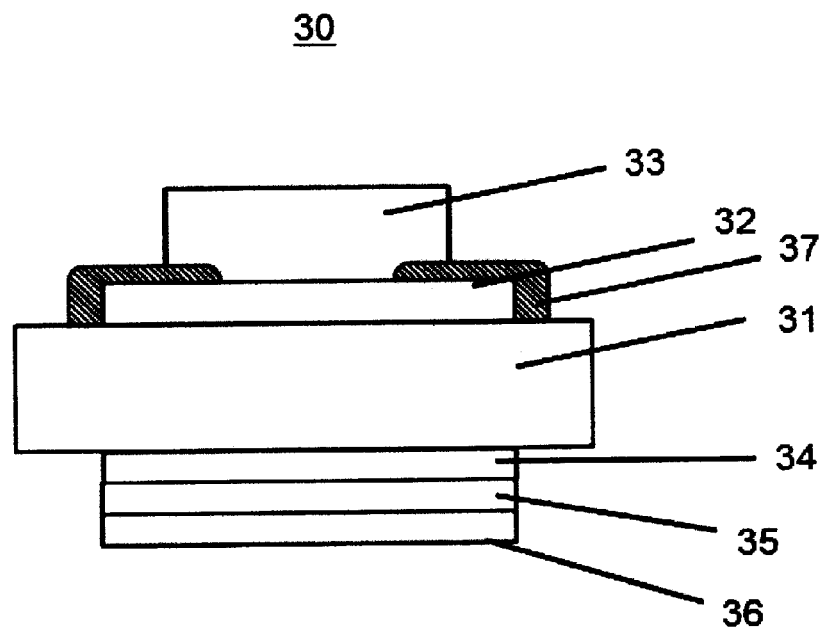
FIG. 3 is a cross-sectional view schematically illustrating one embodiment of the Schottky barrier diode element according to the invention.
Figure 4:
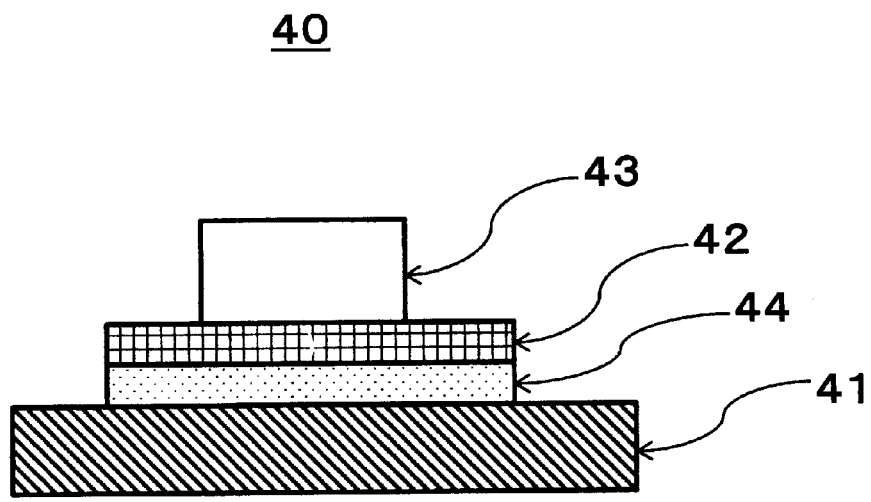
FIG. 4 is a cross-sectional view schematically illustrating an oxide semiconductor substrate including the structure according to the invention obtained in Example 7.

FIG. 3 is a cross-sectional view schematically illustrating a Schottky barrier diode element obtained in Example 6.

An n-type Si substrate 31 having a resistivity of 0.02 Ω·cm was provided, and treated with diluted hydrofluoric acid to remove a natural oxide film from the surface of the Si substrate. The Si substrate (wafer) was placed in a sputtering device ("HSM552" manufactured by Shimadzu Corporation). $Ga_2O_3$ including 1 wt % of Zr (this composition is hereinafter referred to as "Zr—$Ga_2O_3$") was used as the sputtering target. A sputtering discharge was effected at an RF power of 100 W to form a Zr—$Ga_2O_3$ film 32 having a thickness of 300 nm.

A negative resist (manufactured by AZ Electronic Materials) was applied to the Zr—$Ga_2O_3$ film 32 using a spin coating method. The resist was pre-baked, exposed, developed, and post-baked to form a ring-like recess pattern at the edge of the Zr—$Ga_2O_3$ film. The Si substrate (wafer) was placed in the sputtering device, and an $SiO_2$ film having a thickness of 50 nm was formed by sputtering (RF power: 100 W, 50 min) using $SiO_2$ as the target. The Si substrate was immersed in a resist stripper to remove unnecessary resist together with the Zr—$Ga_2O_3$ film. A guard ring 37 for the Zr—$Ga_2O_3$ film was thus formed. A Pt electrode 33 and an ohmic electrode (Ti film 34, Ni film 35, and Au film 36) were formed in the same manner as in Example 1 to obtain a Schottky barrier diode element 30 provided with the guard ring.

The measurement results for the current-voltage characteristics are shown in Table 1. The Schottky barrier diode element 30 exhibited breakdown voltage characteristics better than those of the Schottky barrier diode element 10 of Example 1 due to the effect of the guard ring.

TABLE 1

|  | Example 1 | Example 2 | Example 3 | Example 4 | Example 5 | Example 6 |
|---|---|---|---|---|---|---|
| Schottky electrode | Pt | Pd | Pd | Pd | Ni | Pt |
| Work function | 5.6 | 5.4 | 5.4 | 5.4 | 5.1 | 5.6 |
| Si wafer | n-type | n-type | n-type | n-type | p-type | n-type |
| Ohmic electrode | Ti/Ni/Au | Ti/Ni/Au | Ti/Ni/Au | Ti/Ni/Au | Ti/Ni/Au | Ti/Ni/Au |
| Semiconductor composition (wt %) | $Ga_2O_3 + SiO_2$ (500 ppm) | $Ga_2O_3:TiO_2 =$ 98:2 wt % | $Ga_2O_3:SnO_2 =$ 99:1 wt % | $Ga_2O_3 + Si$ 0.5 wt % (ion doping) | $Ga_2O_3:SnO_2 =$ 99:1 wt % | $Ga_2O_3:ZrO_2 =$ 99:1 wt % |
| Semiconductor composition (at %) | Ga:Si = 99.96:0.04 | Ga:Ti = 99.77:0.023 | Ga:Sn = 98.8:1.2 | Ga:Si = 99.38:0.62 | Ga:Sn = 99.8:1.2 | Ga:Zr = 99.24:0.76 |
| Annealing after film formation of semiconductor | Nitrogen, 500° C., 0.5 h | Nitrogen, 400° C., 0.5 h | Nitrogen, 500° C., 0.5 h | Air, 500° C., 1 h | Nitrogen, 500° C., 0.5 h | Nitrogen, 500° C., 0.5 h |
| Annealing after SBD was formed | Air, 200° C., 1 h | Air, 200° C., 1 h | Air, 200° C., 1 h | Air, 200° C., 1 h | Air, 200° C., 1 h | Air, 200° C., 1 h |
| Carrier concentration ($cm^{-3}$) | $5 \times 10^{15}$ | $2 \times 10^{16}$ | $2 \times 10^{16}$ | $2 \times 10^{16}$ | $1 \times 10^{15}$ | $1 \times 10^{15}$ |
| n-value | 1.7 | 1.3 | 1.3 | 1.3 | 1.3 | 1.3 |
| Dielectric breakdown field (MV/cm) | 0.77 | 0.5 | 0.5 | 1.0 | 0.7 | 0.67 |
| Semiconductor XRD measurement result | Polycrystalline | Polycrystalline | Polycrystalline | Polycrystalline | Polycrystalline | Polycrystalline |
| Substrate | Si wafer | Si wafer | Si wafer | Si wafer | Si wafer | Si wafer |
| Contact electrode | Si | Si | Si | Si | Si | Si |
| Work function (eV) of ohmic electrode | 4.1 | 4.1 | 4.1 | 4.1 | 4.1 | 4.1 |
| Upper electrode | Pt | Pd | Pd | Pd | Ni | Pt |
| Forward voltage (V) | 0.8 | 0.7 | 0.7 | 0.7 | 1.2 | 1.2 |
| On-current ($A/cm^2$) | >10 | >10 | >10 | >10 | >10 | >10 |
| Thickness (nm) | 300 | 300 | 300 | 300 | 300 | 300 |

Example 7

An n-type Si substrate (diameter: 4 inches) having a resistivity of 0.02 Ω·cm was provided. The Si substrate (wafer) was placed in a sputtering device ("HSM552" manufactured by Shimadzu Corporation), and a Ti film (15 nm) and a Pd film (50 nm) were sequentially formed by sputtering using a circular area mask. After exchanging the area mask, a $Ga_2O_3:SnO_2$ film having a thickness of 200 nm was formed by sputtering (RF power: 100 W, Ar 100%) using a sintered $Ga_2O_3:SnO_2$ (=99.9:0.1 wt %) target. The resulting structure was placed on a hot plate, and annealed at 300° C. for 1 hour in air.

Figure 5:
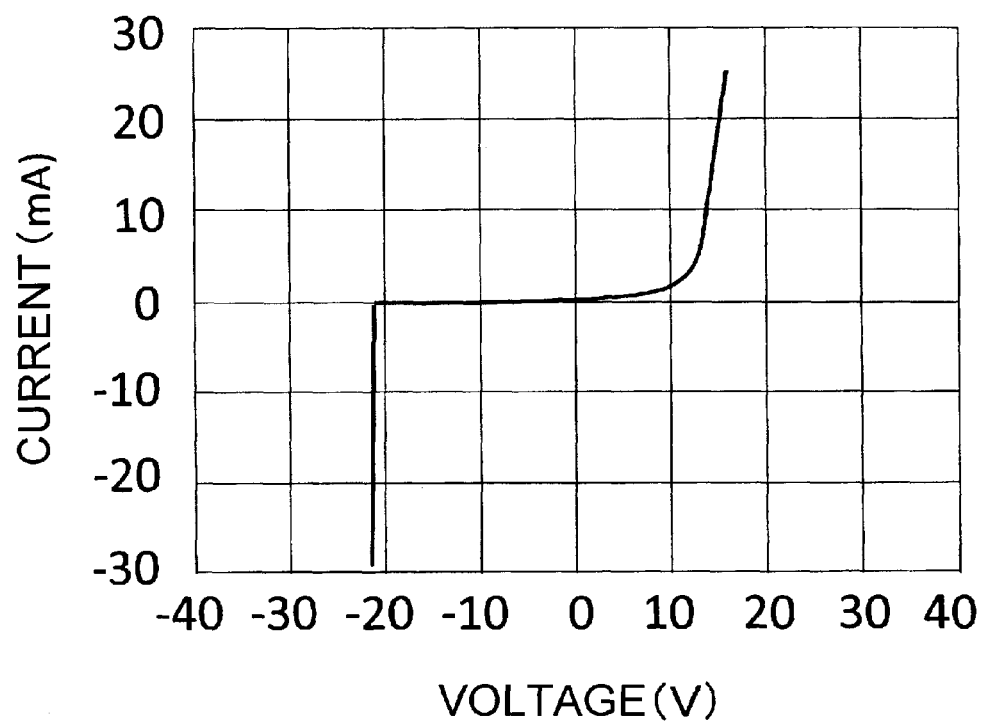
FIG. 5 is a graph illustrating the current-voltage characteristics of the structure obtained in Example 7.

The current-voltage characteristics of the resulting structure were evaluated as described below. A product "SCS-4200" manufactured by Toyo Corporation was used as a source meter. The source terminal was connected to the oxide semiconductor, and the drain terminal was connected to the Pd electrode. A tungsten needle was used as the terminal. A current that flowed through the element was measured while changing the drain voltage. The resulting current-voltage characteristics showed clear rectifying characteristics (see FIG. 5). Note that the work function of the Schottky electrode was measured using a photoelectron spectrometer "AC-3" manufactured by Riken Keiki Co., Ltd.

The $Ga_2O_3:SnO_2$ thin film was subjected to XRD measurement. As a result, no diffraction peak was observed except for the sample stage and the Si substrate (wafer), and it was found that the $Ga_2O_3:SnO_2$ thin film was an amorphous film.

The following XRD measurement conditions were used.
Device: "SmartLab" manufactured by Rigaku Corporation
X-ray: Cu-Kπ line (wavelength: 1.5406 Å, monochromatized using a graphite monochromator)
2θ-θ reflection method, continuous scan (1.0°/min)
Sampling interval: 0.02°
Slit DS, SS: 2/3°, RS: 0.6 mm Example 8

Figure 6:
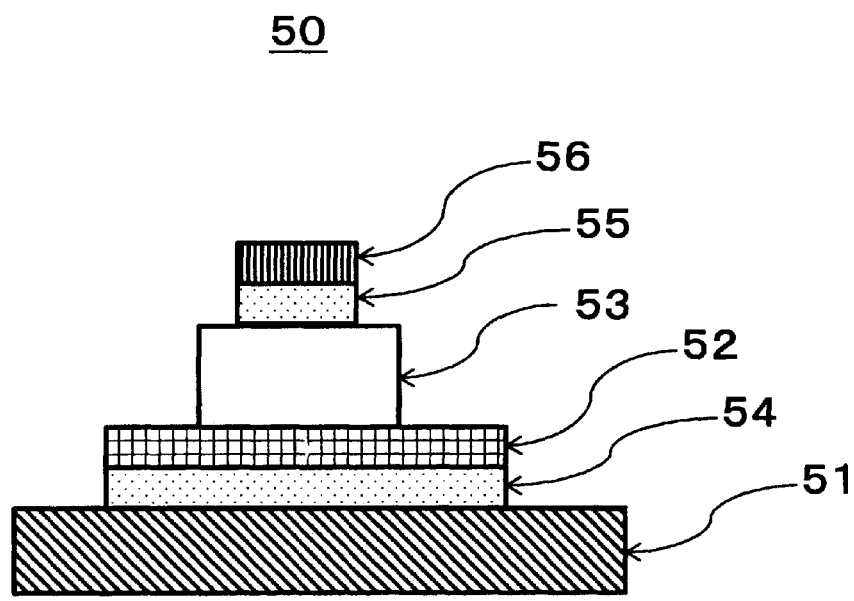
FIG. 6 is a cross-sectional view schematically illustrating the Schottky barrier diode element according to the invention obtained in Example 8.
Figure 7:
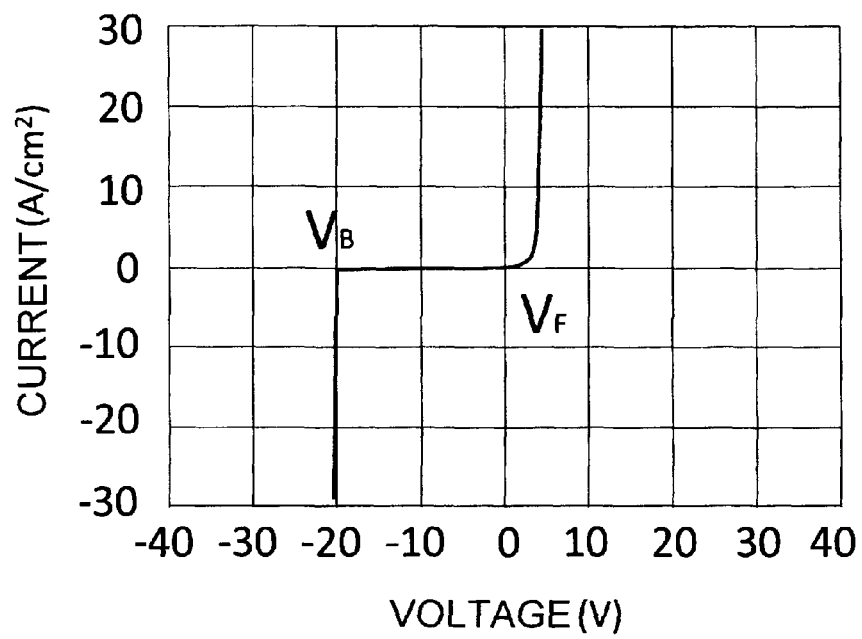
FIG. 7 is a graph illustrating the current-voltage characteristics of the Schottky barrier diode element according to the invention obtained in Example 8.
Figure 8:
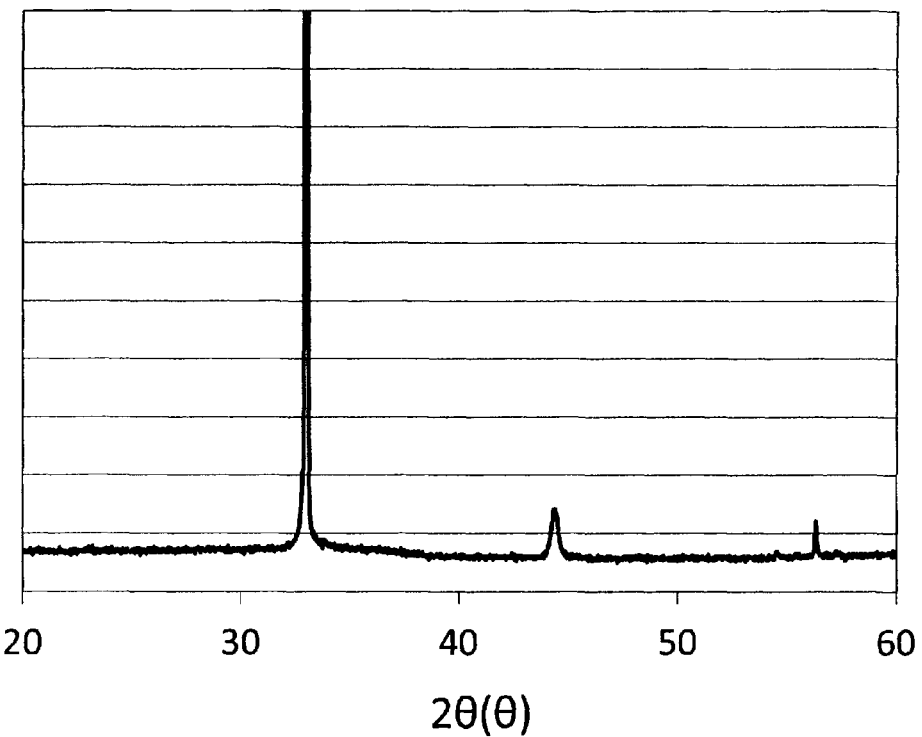
FIG. 8 illustrates the X-ray diffraction chart (XRD) of the oxide semiconductor film obtained in Example 8.
Figure 9:
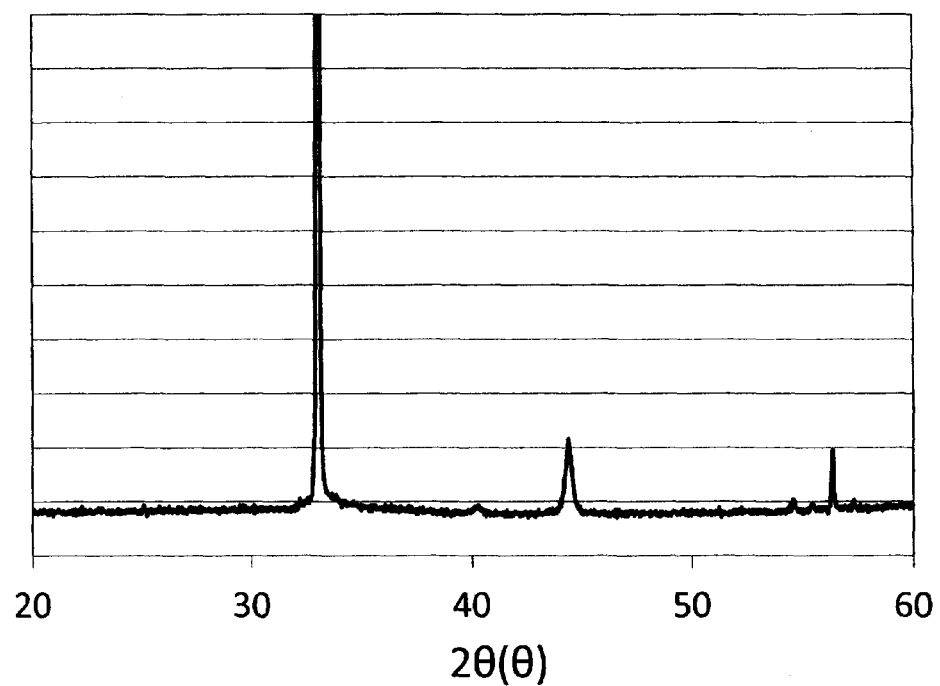
FIG. 9 illustrates the X-ray diffraction chart (XRD) of the oxide semiconductor film obtained in Example 10.
Figure 10:
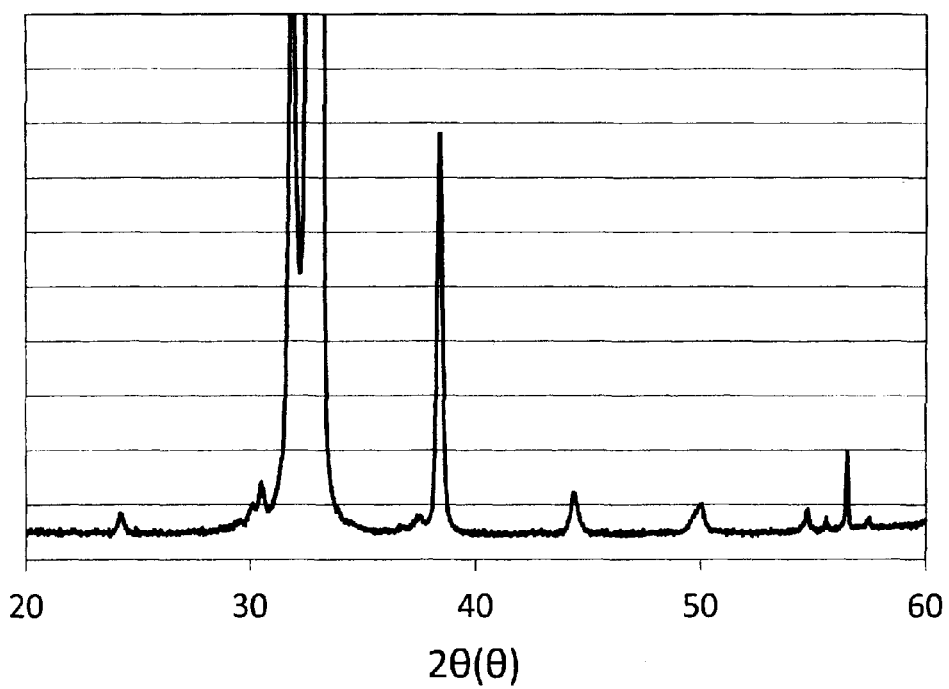
FIG. 10 illustrates the X-ray diffraction chart (XRD) of the oxide semiconductor film obtained in Comparative Example 2.

The structure produced in Example 7 was placed in the sputtering device, and a Ti film (50 nm) and an Au film (50 nm) were sequentially formed by sputtering using an area mask having a diameter of 1 mm. FIG. 6 is a view schematically illustrating the resulting stack. The current-voltage characteristics were evaluated in the same manner as in Example 7. The current density was calculated by dividing the amount of current by the area of the hole of the area mask having a diameter of 1 mm, and found to be 30 $A/cm^2$ or more (forward current). The forward turn-on voltage (Vf) significantly decreased (i.e., 2.5 V) due to the provision of the ohmic electrode. The breakdown voltage when a reverse bias was applied was −30 V, and the dielectric breakdown field intensity was 1.5 MV/cm.

The results are summarized in Table 2.

Examples 9 to 16

A structure similar to that of Example 8 was evaluated while changing the semiconductor material and the electrode material. The results are shown in Table 2. Note that the term "microcrystal" in Table 2 is classified as a polycrystal.

In Example 10, an inexpensive polycrystalline Si wafer was used as the substrate. Pt was used for the Schottky electrode, and the composition "$Ga_2O_3:SiO=99.9:0.1$ wt %" was used for the semiconductor. After forming the semiconductor film, the resulting stack was annealed at 400° C. for 1 hour in air. The film had a microcrystalline structure.

In Example 11, an alkali-free glass substrate was used as the substrate. In Example 12, a polyimide substrate was used as the substrate. In Examples 13 and 14, a polycarbonate resin substrate coated with $SiO_2$ (hard coat) was used as the substrate. These substrates are insulating substrates. Since the element according to the invention can be produced without using a monocrystalline semiconductor, it is possible to produce the element using such a wide variety of substrates. In Example 14, the dielectric breakdown field decreased to 0.2 MV/cm since the concentration of Ga based on the total metal elements forming the semiconductor was 88.8 at % that is lower than the preferable range. However, a performance comparable to that of a diode level that utilizes crystalline silicon was obtained.

In Example 15, since the stack was annealed at 600° C. for 1 hour in air in the final step, a polycrystalline structure was formed. Therefore, the dielectric breakdown field decreased. However, the forward voltage was 0.1 V, and a diode having low internal resistance was obtained.

In Example 16, a diode was formed using a pure $Ga_2O_3$ film. As a result, the forward voltage increased to 25 V. However, good results were obtained for the dielectric breakdown field and the On-current.

Comparative Example 1

A Schottky barrier diode was produced in the same manner as in Example 8, except that sputtering was performed using SiC as the target instead of the $Ga_2O_3$-based material. The Schottky barrier diode showed rectifying characteristics to some extent, but a performance comparable to that achieved using $Ga_2O_3$:$SnO_2$ (=99.9:0.1 wt %) was not obtained. SiC is a promising material for a next-generation power device. However, it was found that it is difficult to use SiC as a material for producing a diode when SiC is not epitaxially grown on a monocrystalline substrate.

Comparative Example 2

In Comparative Example 2, Mo having a small work function was used to form the Schottky electrode. As a result, diode characteristics were not observed.

TABLE 2

|  | Example 7 | Example 8 | Example 9 | Example 10 | Example 11 |
|---|---|---|---|---|---|
| Schottky electrode | Pd | Pd | Pd | Pt | Ni |
| Work function (eV) of Schottky electrode | 5.5 | 5.5 | 5.5 | 5.6 | 5.6 |
| Si wafer | n-type | n-type | n-type | n-type | — |
| Ohmic electrode | W | Ti | Ti | Ti | Ti |
| Semiconductor composition (wt %) | $Ga_2O_3$:$SnO_2$ = 99.9:0.1 wt % | $Ga_2O_3$:$SnO_2$ = 99.9:0.1 wt % | $Ga_2O_3$:$SnO_2$ = 99.9:0.1 wt % | $Ga_2O_3$:$SiO_2$ = 99.9:0.1 wt % | $Ga_2O_3$:$TiO_2$ = 99.9:0.1 wt % |
| Semiconductor composition (at %) | Ga:Sn = 99.88:0.12 at % | Ga:Sn = 99.88:0.12 at % | Ga:Sn = 99.88:0.12 at % | Ga:Si = 99.84:0.16 at % | Ga:Ti = 99.88:0.12 at % |
| Annealing after film formation of semiconductor | Air, 300° C., 1 h | Air, 300° C., 1 h | Air, 300° C., 1 h | Air, 400° C., 1 h | Air, 200° C., 1 h |
| Annealing after SBD was formed | Not performed | Not performed | Air, 400° C., 1 h | Air, 350° C., 1 h | Not performed |
| Band gap (eV) | 4.8 | 4.8 | 4.8 | 4.8 | 4.8 |
| Carrier concentration ($cm^{-3}$) | $5 \times 10^{15}$ | $5 \times 10^{15}$ | $5 \times 10^{15}$ | $5 \times 10^{15}$ | $7 \times 10^{15}$ |
| n-value | 2.3 | 2.5 | 2.1 | 1.9 | 2.3 |
| Dielectric breakdown field Vb (MV/cm) | 1.1 | 1.5 | 1 | 0.8 | 0.9 |
| Semiconductor XRD measurement result | Amorphous | Amorphous | Micro-crystalline | Micro-crystalline | Amorphous |
| Substrate | Si wafer | Si wafer | Si wafer | Poly-crystalline Si wafer | Alkali-free glass |
| Contact electrode | Ti | Ti | Ti | Ti | Mo |
| Work function (eV) of ohmic electrode | 4.5 | 4.1 | 4.1 | 4.1 | 4 |
| Upper electrode | None | Au | Au | Au | Au |
| Forward voltage (V) | 12 | 2.5 | 2 | 2.2 | 3.1 |
| On-current ($A/cm^2$) | — | >10 | >10 | >10 | >10 |
| Thickness (nm) | 200 | 200 | 200 | 200 | 200 |

|  | Example 12 | Example 13 | Example 14 | Example 15 | Example 16 |
|---|---|---|---|---|---|
| Schottky electrode | Ni | Ni | Ni | Pd | Pd |
| Work function (eV) of Schottky electrode | 5.1 | 5.1 | 5.1 | 5.5 | 5.5 |
| Si wafer | — | — | — | n-type | n-type |
| Ohmic electrode | Al—Nd | Ti | Ti | Ti | Ti |
| Semiconductor composition (wt %) | $Ga_2O_3$:$GeO_2$ = 99.99:0.01 wt % | $Ga_2O_3$:$SnO_2$ = 92:8 wt % | $Ga_2O_3$:$SnO_2$ = 90:10 wt % | $Ga_2O_3$:$SiO_2$ = 99.9:0.1 wt % | $Ga_2O_3$ |
| Semiconductor composition (at %) | Ga:Ge = 99.91:0.09 at % | Ga:Sn = 90.24:9.76 at % | Ga:Sn = 88.8:11.2 at % | Ga:Si = 99.88:0.12 at % | Ga = 100 at % |
| Annealing after film formation of semiconductor | Air, 300° C., 1 h | Air, 300° C., 1 h | Air, 300° C., 1 h | Air, 300° C., 1 h | Air, 300° C., 1 h |
| Annealing after SBD was formed | Not performed | Not performed | Not performed | Air, 600° C., 1 h | Not performed |
| Band gap (eV) | 4.8 | 4.6 | 4.4 | 4.8 | 4.8 |
| Carrier concentration ($cm^{-3}$) | $5 \times 10^{15}$ | $1 \times 10^{16}$ | $1 \times 10^{16}$ | $5 \times 10^{15}$ | $3 \times 10^{14}$ |
| n-value | 2.4 | 2.1 | 2.5 | 2.5 | 3.5 |
| Dielectric breakdown field Vb (MV/cm) | 0.9 | 0.7 | 0.2 | 0.05 | 1 |
| Semiconductor XRD measurement result | Amorphous | Amorphous | Amorphous | Poly-crystalline | Amorphous |
| Substrate | Polyimide | PC provided with $SiO_2$ | PC provided with $SiO_2$ | Poly-crystalline Si wafer | Si wafer |
| Contact electrode | Mo | Ti | Ti | Ti | Ti |
| Work function (eV) of ohmic electrode | 4 | 4.5 | 4.5 | 4.1 | 4.1 |

TABLE 2-continued

| | | | | | |
|---|---|---|---|---|---|
| Upper electrode | Au | Au | Au | Au | Au |
| Forward voltage (V) | 3 | 2.5 | 2.5 | 0.1 | 25 |
| On-current (A/cm$^2$) | >10 | >10 | >10 | >10 | >10 |
| Thickness (nm) | 200 | 200 | 200 | 200 | 200 |

| | Comparative Example 1 | Comparative Example 2 |
|---|---|---|
| Schottky electrode | Pd | Mo |
| Work function (eV) of Schottky electrode | 5.5 | 4.4 |
| Si wafer | n-type | n-type |
| Ohmic electrode | Ti | Ti |
| Semiconductor composition (wt %) | SiC | Ga$_2$O$_3$:SnO$_2$ = 99.9:0.1 wt % |
| Semiconductor composition (at %) | Si:C = 50:50 at % | Ga:Sn = 99.88:0.12 at % |
| Annealing after film formation of semiconductor | Air, 300° C., 1 h | Air, 300° C., 1 h |
| Annealing after SBD was formed | Not performed | Not performed |
| Band gap (eV) | 2.7 | 4.8 |
| Carrier concentration (cm$^{-3}$) | 5 × 10$^{15}$ | 5 × 10$^{15}$ |
| n-value | 4 | — |
| Dielectric breakdown field Vb (MV/cm) | 0.2 | Leakage occurred |
| Semiconductor XRD measurement result | Poly-crystalline (c-SiC) | Amorphous |
| Substrate | Si wafer | Si wafer |
| Contact electrode | Ti | Ti |
| Work function (eV) of ohmic electrode | 4.1 | 4.1 |
| Upper electrode | Au | Au |
| Forward voltage (V) | 10.3 | Leakage occurred |
| On-current (A/cm$^2$) | 0.1 | Leakage occurred |
| Thickness | 200 | 200 |

Examples 17 to 23

A structure similar to that of Example 8 was evaluated while changing the semiconductor material, the thickness of the semiconductor film, and the type of substrate. The results are shown in Table 3. The semiconductor film was formed by sputtering. The thickness of the semiconductor film formed in Example 17 was 200 nm, the thickness of the semiconductor film formed in Examples 18, 20, and 22 was 1 μm, and the thickness of the semiconductor film formed in Examples 19, 21, and 23 was 10 μm.

Note that "4H-SiC" in Table 3 refers to a hexagonal SiC substrate having a 4-layer repeating structure, and "YSZ" in Table 3 refers to a yttrium-stabilized zirconia substrate.

TABLE 3

| | Example 17 | Example 18 | Example 19 | Example 20 | Example 21 |
|---|---|---|---|---|---|
| Schottky electrode | Ni | Ni | Ni | Ni | Ni |
| Work function (eV) of Schottky electrode | 5.1 | 5.1 | 5.1 | 5.1 | 5.1 |
| Si wafer | n-type | — | — | n-type | — |
| Ohmic electrode | Ti | Ti | Ti | Ti | Ti |
| Semiconductor composition (wt %) | Ga$_2$O$_3$ | Ga$_2$O$_3$ | Ga$_2$O$_3$ | Ga$_2$O$_3$:TiO$_2$ = 98:2 wt % | Ga$_2$O$_3$:TiO$_2$ = 96:4 wt % |
| Semiconductor composition (at %) | Ga = 100 at % | Ga = 100 at % | Ga = 100 at % | Ga:Sn = 95.4:4.6 at % | Ga:Ti = 91.1:8.9 at % |
| Annealing after film formation of semiconductor | Air, 150° C., 1 h | Air, 150° C., 1 h | Air, 150° C., 1 h | Air, 150° C., 1 h | Air, 150° C., 1 h |
| Annealing after SBD was formed | Not performed | Not performed | Not performed | Not performed | Not performed |
| Band gap | 4.8 | 4.8 | 4.8 | 4.7 | 4.7 |
| Carrier concentration (cm$^{-3}$) | 3 × 10$^{14}$ | 3 × 10$^{14}$ | 3 × 10$^{14}$ | 4 × 10$^{14}$ | 6 × 10$^{14}$ |
| n-value | 2.8 | 2.9 | 2.7 | 2.8 | 2.8 |
| Dielectric breakdown field Vb (MV/cm) | 2.5 | 2.4 | 2.4 | 1.8 | 1.6 |
| Semiconductor XRD measurement result | Amorphous | Amorphous | Amorphous | Amorphous | Micro-crystalline |
| Substrate | Si wafer | Sapphire | 4H—SiC | Si wafer | YSZ |
| Contact electrode | Ti | Ti | Ti | Ti | Ti |
| Work function (eV) of ohmic electrode | 4.1 | 4.1 | 4.1 | 4.1 | 4.1 |
| Upper electrode | Au | Au | Au | Au | Au |
| Forward voltage (V) | 2.8 | 2.4 | 2.2 | 2 | 2 |

TABLE 3-continued

| On-current (A/cm$^2$) | >10 | >10 | >10 | >10 | >10 |
|---|---|---|---|---|---|
| Thickness (μm) | 0.2 | 1.0 | 10 | 1.0 | 10 |

|  | Example 22 | Example 23 | Example 24 |
|---|---|---|---|
| Schottky electrode | Ni | Ni | Ni |
| Work function (eV) of Schottky electrode | 5.1 | 5.1 | 5.1 |
| Si wafer | n-type | — | — |
| Ohmic electrode | Ti | Ti | Ti |
| Semiconductor composition (wt %) | $Ga_2O_3$:$SnO_2$ = 95:5 wt % | $Ga_2O_3$:$SnO_2$ = 90:10 wt % | $Ga_2O_3$:$Al_2O_3$ = 90:10 wt % |
| Semiconductor composition (at %) | Ga:Si = 96.8:3.2 at % | Ga:Ti = 93.5:6.5 at % | Ga:Al = 83.0:17.0 at % |
| Annealing after film formation of semiconductor | Air, 150° C., 1 h | Air, 150° C., 1 h | Air, 150° C., 1 h |
| Annealing after SBD was formed | Not performed | Not performed | Not performed |
| Band gap | 4.6 | 4.4 | 5.2 |
| Carrier concentration (cm$^{-3}$) | $2 \times 10^{15}$ | $4 \times 10^{15}$ | $8 \times 10^{14}$ |
| n-value | 2.9 | 2.9 | 3.5 |
| Dielectric breakdown field Vb (MV/cm) | 1.6 | 1.5 | 3.1 |
| Semiconductor XRD measurement result | Amorphous | Amorphous | Amorphous |
| Substrate | Poly-crystalline Si wafer | Alkali-free glass | Alkali-free glass |
| Contact electrode | Ti | Mo | Mo |
| Work function (eV) of ohmic electrode | 4.1 | 4 | 4 |
| Upper electrode | Au | Au | Au |
| Forward voltage (V) | 2.2 | 3.1 | 3.1 |
| On-current (A/cm$^2$) | >10 | >10 | >10 |
| Thickness (μm) | 1.0 | 10 | 10 |

As described in detail above, it is possible to obtain rectifying characteristics better than those of a Schottky barrier diode that utilizes crystalline silicon by utilizing a gallium oxide-based material and a device (e.g., sputtering device) that achieves high mass productivity. The diode according to the invention exhibits sufficient rectifying characteristics even when produced at a low temperature equal to or less than 300° C. Therefore, the diode according to the invention can be produced using a glass substrate, a resin substrate, and the like.

INDUSTRIAL APPLICABILITY

The Schottky barrier diode element according to the invention may suitably be used for an electric circuit, an electric apparatus, an electronic apparatus, a vehicle, an electric vehicle, and the like for which high-speed operation and high-speed switching characteristics are required.

Although only some exemplary embodiments and/or examples of the invention have been described in detail above, those skilled in the art will readily appreciate that many modifications are possible in the exemplary embodiments and/or examples without materially departing from the novel teachings and advantages of the invention. Accordingly, all such modifications are intended to be included within the scope of the invention.

The specification of the Japanese patent application to which the present application claims priority under the Paris Convention is incorporated herein by reference in its entirety.

The invention claimed is:

1. A Schottky barrier diode element comprising an n-type or p-type silicon (Si) substrate, an oxide semiconductor layer, and a Schottky electrode layer, the oxide semiconductor layer comprising either or both of a polycrystalline oxide that comprises gallium (Ga) as a main component and an amorphous oxide that comprises gallium (Ga) as a main component.

2. A Schottky barrier diode element comprising an n-type or p-type silicon (Si) substrate, an oxide semiconductor layer, and a Schottky electrode layer, the oxide semiconductor layer comprising a polycrystalline oxide that comprises gallium (Ga) as a main component.

3. The Schottky barrier diode element according to claim 1, wherein the oxide semiconductor layer comprises gallium at an atomic percentage ([Ga]/([Ga]+[total metal elements other than Ga])×100) of 90 to 100 at %.

4. The Schottky barrier diode element according to claim 1, wherein the oxide semiconductor layer is formed on the silicon substrate, and the Schottky electrode layer is formed on the oxide semiconductor layer.

5. The Schottky barrier diode element according to claim 1, wherein the Schottky electrode layer is formed on the silicon substrate, and the oxide semiconductor layer is formed on the Schottky electrode layer.

6. The Schottky barrier diode element according to claim 1, wherein the oxide semiconductor layer comprises at least one element selected from Si, Ge, Sn, Ti, Zr, and Hf in a ratio of 0.01 at % to 10 at % based on total metal elements included in the oxide semiconductor layer.

7. The Schottky barrier diode element according to claim 1, wherein the oxide semiconductor layer has a carrier concentration of $1 \times 10^{14}$ cm$^{-3}$ or more and $1 \times 10^{17}$ cm$^{-3}$ or less at room temperature.

8. The Schottky barrier diode element according to claim 1, wherein the Schottky electrode layer is a metal thin film having a work function of 4.7 eV or more.

9. The Schottky barrier diode element according to claim 1, wherein the oxide semiconductor layer is covered with an insulating film so that an edge of the oxide semiconductor layer is not exposed.

10. An electric circuit comprising the Schottky barrier diode element according to claim 1.

11. An electric apparatus comprising the Schottky barrier diode element according to claim 1.

12. An electronic apparatus comprising the Schottky barrier diode element according to claim 1.

13. A vehicle comprising the Schottky barrier diode element according to claim 1.

14. A structure comprising a metal thin film having a work function of 4.7 eV or more, and an oxide semiconductor that comprises Ga as a main component, the structure having a region in which the metal thin film and the oxide semiconductor electrically contact with each other.

15. The structure according to claim 14, wherein the oxide semiconductor that comprises Ga as a main component comprises at least one element selected from Si, Ge, Sn, and Ti in a ratio of 0.01 at % or more and 10 at % or less based on total metal elements included in the oxide semiconductor.

16. The structure according to claim 14, wherein the oxide semiconductor comprises gallium at an atomic percentage ([Ga]/([Ga]+[total metal elements other than Ga])×100) of 90 to 100 at %.

17. The structure according to claim 14, wherein the oxide semiconductor has a carrier concentration of $1 \times 10^{14}$ cm$^{-3}$ or more and $1 \times 10^{17}$ cm$^{-3}$ or less at room temperature.

18. The structure according to claim 14, wherein the oxide semiconductor has a thickness of 50 nm to 20 µm.

19. The structure according to claim 14, wherein the metal thin film is formed of Au, Cr, Cu, Fe, Ir, Mo, Nb, Ni, Pd, Pt, Re, Ru, W, In$_2$O$_3$, In—Sn—O, or In—Zn—O.

20. An oxide semiconductor substrate comprising a conductive substrate, and the structure according to claim 14 that is stacked on the conductive substrate.

21. The oxide semiconductor substrate according to claim 20, wherein the conductive substrate is formed of one or more materials selected from monocrystalline silicon, polycrystalline silicon, and microcrystalline silicon.

22. An oxide semiconductor substrate comprising an insulating substrate, and the structure according to claim 14 that is stacked on the insulating substrate.

23. A power semiconductor element wherein the oxide semiconductor substrate according to claim 20 is used.

24. A diode element wherein the oxide semiconductor substrate according to claim 20 is used.

25. A Schottky barrier diode element wherein the oxide semiconductor substrate according to claim 20 is used.

26. A Schottky barrier diode element comprising the oxide semiconductor substrate according to claim 20, the oxide semiconductor that comprises Ga as a main component being an oxide semiconductor layer, and the metal thin film having a work function of 4.7 eV or more being a Schottky electrode layer.

27. An electric circuit comprising one or more elements selected from a group consisting of:
(a) a power semiconductor element wherein an oxide semiconductor substrate is used,
said oxide semiconductor substrate comprising a conductive substrate, and a structure that is stacked on the conductive substrate,
said structure comprising a metal thin film having a work function of 4.7 eV or more, and an oxide semiconductor that corn rises Ga as a main component,
said structure having a region in which the metal thin film and the oxide semiconductor electrically contact with each other;
(b) a diode element wherein an oxide semiconductor substrate is used,
said oxide semiconductor substrate comprising an insulating substrate, and a structure that is stacked on the insulating substrate,
said structure comprising a metal thin film having a work function of 4.7 eV or more, and an oxide semiconductor that comprises Ga as a main component,
said structure having a region in which the metal thin film and the oxide semiconductor electrically contact with each other; and
(c) the Schottky barrier diode element according to claim 25.

28. An electric apparatus comprising the electric circuit according to claim 27.

29. An electronic apparatus comprising the electric circuit according to claim 27.

30. A vehicle comprising the electric circuit according to claim 27.

\* \* \* \* \*